United States Patent [19]
Yagi

[11] Patent Number: 5,642,369
[45] Date of Patent: Jun. 24, 1997

[54] QUICK RESYNCHRONIZATION RECEIVER FOR SEQUENTIAL DECODING OF CONVOLUTIONAL CODES

[75] Inventor: Toshiharu Yagi, Tokyo, Japan

[73] Assignee: NEC Corporation, Tokyo, Japan

[21] Appl. No.: 328,088

[22] Filed: Oct. 24, 1994

Related U.S. Application Data

[63] Continuation-in-part of Ser. No. 737,547, Jul. 30, 1991, abandoned, which is a continuation-in-part of Ser. No. 229,416, Aug. 8, 1988, abandoned.

[30] Foreign Application Priority Data

| Aug. 7, 1987 | [JP] | Japan | 62-197682 |
| Oct. 20, 1987 | [JP] | Japan | 62-265643 |

[51] Int. Cl.$^6$ ............................................. H03M 13/12
[52] U.S. Cl. ............................................. 371/46
[58] Field of Search ............................. 371/43, 44, 45, 371/46

[56] References Cited

U.S. PATENT DOCUMENTS

| 3,665,396 | 5/1972 | Forney, Jr. | 340/146.1 |
| 4,539,684 | 9/1985 | Kloker | 371/46 |

OTHER PUBLICATIONS

Communication from the European Patent Office dated Oct. 10, 1991.
Fano, R., "A Hewristic Discussion of Probabilistic Decoding", *IEEE Transactions on Information Theory*, Apr. 1963, pp. 64–74.

*Primary Examiner*—Stephen M. Baker
*Attorney, Agent, or Firm*—Sughrue, Mion, Zinn, Macpeak & Seas

[57] ABSTRACT

In a digital receiver, convolutionally coded symbol bits are recovered from a received orthogonally modulated signal. The symbol bits are sequentially stored into a memory and each stored symbol bit is read from the memory as specified by a decoding point address into a sequential decoder, which uses a clock pulse as a boundary point of a codeword. If an overflow condition is detected in the memory, the decoding point address is advanced by K bits. If the overflow still exists, it is repeatedly advanced further by K bits. If the overflow is still detected, then the codeword boundary point is shifted by a clock interval. If the overflow continues, the boundary point shifting is repeated. If the boundary point shifting fails to alleviate the problem, then the decoding point address is advanced to a most recent symbol bit and the recovered symbol bits are phase-shifted by 90 degrees. If a suboverflow condition is detected, the decoding point address is advanced to a most recent symbol bit, and the boundary point shifting is again performed and repeated if the suboverflow still exists. If the suboverflow condition still exists after the boundary point shifting is repeated, the decoding point address is again advanced to a most recent symbol bit and the phase timing shift and the codeword boundary point shift are repeated again.

7 Claims, 3 Drawing Sheets

QUICK RESYNCHRONIZATION RECEIVER FOR SEQUENTIAL DECODING OF CONVOLUTIONAL CODES

RELATED APPLICATION

This application is a continuation-in-part application of U.S. patent application Ser. No. 07/737,547, filed Jul. 30, 1991, now abandoned, which is a continuation-in-part of Ser. No. 07/229,416, filed Aug. 8, 1988, now abandoned, and assigned to the same assignee as the present application.

BACKGROUND OF THE INVENTION

The present invention relates to a digital radio receiver using a sequential decoder for decoding convolutional codes.

In order to detect errors in transmitted data bits and correct the data bits in error, the current practice involves segmenting data to be transmitted into several information symbols and converting them into convolutionally coded symbols using a forward error correction encoder and decoding transmitted symbols by an error correction decoder according to an algorithm which is known as the Fano algorithm.

According to the Fano algorithm developed by R. M. Fano and described in IEEE Transactions on Information Theory, IT-9 (1963), pages 64–74, the signal received by a decoder for hard-decision decoding does not necessarily match what is actually transmitted due to lost or corruption of data bits or due to ambiguities present in the amplitude levels of demodulated QAM or PSK signals resulting from phase errors introduced to the recovered carrier. If the decoder performs its decoding step on a per codeword basis, the decoder can be said to have the same circuit function as the error correction encoder, or a "replica of the encoder". On receiving a codeword, the decoder compares it with each of codewords which the replica of the encoder would produce if it were to receive all possible information symbols and assumes an information symbol that is nearest to the received codeword. The yardstick which is currently employed for measuring the distance to the nearest codeword is the Fano likelihood algorithm. According to the Fano algorithm, an information symbol sequence which gives the largest cumulative value is assumed to be the most likely message sequence.

If a large number of burst errors should occur, there is a possibility that the decoder makes a false decision. After making an incorrect decision, the discrepancies between the internal states of the encoder replica and those in the encoder grow much more rapidly than would be the case if the decoder were following the correct path, and all subsequent attempts would fail to find symbols having a large Fano likelihood value, thus making it possible to detect that a false decision has been made in the past. On detecting a false decision, the decoder retraces its path to return the internal states of the encoder replica to a point where the false decision was possibly made and takes an alternate path that gives the next largest cumulative value of the Fano likelihood and performs a decoding step on the selected path. If the decoder should fail in the search, it retraces further back to a past state to repeat the process. In this way, the decoder attempts to search for a correct path on the basis of trial and error. Since the past histories are retraced in the sequential decoder, the input and output symbols are stored in respective input and output buffers. The error correction encoder and decoder mentioned above can be implemented by a circuit shown and described in U.S. Pat. No. 3,665,396 issued to George David Forney, Jr.

In order to achieve the comparison between the output codeword of the encoder replica and the input bit sequence to that replica, the decoder must be able to detect the boundary point of each bit sequence. Thus, the comparison should be performed in synchronism with the boundary point each received bit sequence. Since the received symbol does not usually contain codeword timing information, the prior art sequential decoder performs the code resynchronization process on a trial and error basis.

Since out-of-word timing conditions can result in a situation which is equivalent to the occurrence of a serious transmission error, the decoding process encounters a substantial amount of delay, tending to overflow the input buffer. Such overflow conditions can thus be taken as an indication of the occurrence of an out-of-word timing condition. On detecting an overflow, the decoder shifts the codeword boundary timing by one clock pulse before proceeding to decode on a trial basis a fresh bit sequence entered next into the input buffer. If this trial attempt still does not work to alleviate the overflow, the same process is repeated. Assume that the codeword is made up of n coded bits, there are n possible states which can be retraced to reestablish synchronism. A single unsuccessful trial attempt for resynchronization will cause the input buffer to store the maximum number of symbols that can be stored therein. The maximum amount of time taken to resynchronize the decoder is therefore (n−1) times the interval taken to store the maximum number of symbols into the input buffer. In addition, whole symbols stored in the input buffer must be discarded whenever a resynchronization is attempted. The resynchronization attempt of the prior art sequential decoder can therefore take as long as (n−1) times the whole storage time of the input buffer, and no input data can be received during that interval.

Another important factor that influences the sequential decoding process is the well-known phase ambiguity of orthogonally modulated signals such as 4PSK (phase shift keyed) or 16 QAM (quadrature amplitude modulation) signals associated with the recovered carrier phase at the receiver. Thus, phase differences of an integral multiple of 90 degrees can occur in the case of 4PSK between the transmitted carrier and the recovered carrier. Since the orthogonal modulation employs a technique of alternately separating a bit sequence into two bit groups corresponding to in-phase (P) and quadrature-phase (Q) channels, respectively, the phase differences can result in bit reversals and transposition of channels. For example, a phase error of 90 degrees of a transmitted 4PSK symbol "01" may be converted to "00" and a phase error of 180 degrees of the "01" symbol may be converted to "10".

SUMMARY OF THE INVENTION

It is therefore an object of the present invention to provide a receiver for receiving an orthogonally modulated signal, the receiver being capable of resynchronizing with an incoming data stream in a shorter period of time than is attainable with prior art receivers.

According to the present invention, there is provided a receiver which receives a modulated signal and includes a carrier recovery means for recovering a transmitted carrier from the received signal, a demodulator operating on the received signal for recovering convolutionally coded symbol bits using the recovered carrier, a memory, means for sequentially storing the symbol bits into the memory, means for reading a bit sequence from a decoding point address of the memory, a sequential decoder operating on the read bit sequence using a clock pulse as a timing of a codeword, and an overflow detector for detecting an overflow condition of the memory. A controller is provided to perform the following steps to establish resynchronization:

a) if the overflow condition is detected by the overflow detector, advancing the decoding point address by a predetermined number of bits;

b) if the overflow condition is still detected repeating the step (a);

c) if the overflow condition is still detected, shifting the codeword boundary point by the interval of the clock pulse; and d) if the overflow condition is still detected, repeating the step (c).

According to a preferred embodiment, the receiver receives an orthogonally modulated signal and includes a variable phase shifter for introducing an integral multiple of a predetermined phase shift to the recovered symbol bits in response to a command signal and a suboverflow detector for detecting a suboverflow condition of the memory. The controller further performs the following steps:

e) if the overflow condition is still detected, advancing the decoding point address to a most recent symbol bit;

f) supplying the command signal to the variable phase shifter;

g) if the suboverflow condition is detected by the sub-overflow detector, advancing the decoding point address to a most recent symbol bit, and shifting the codeword boundary point by the interval of the clock pulse;

h) repeating the step (g); and i) if the suboverflow condition is still detected, advancing the decoding point address to a most recent symbol bit and repeating the steps (f), (g) and (h).

BRIEF DESCRIPTION OF THE DRAWINGS

The present invention will be described in further detail with reference to the accompanying drawings, in which.

DETAILED DESCRIPTION

Figure 1:
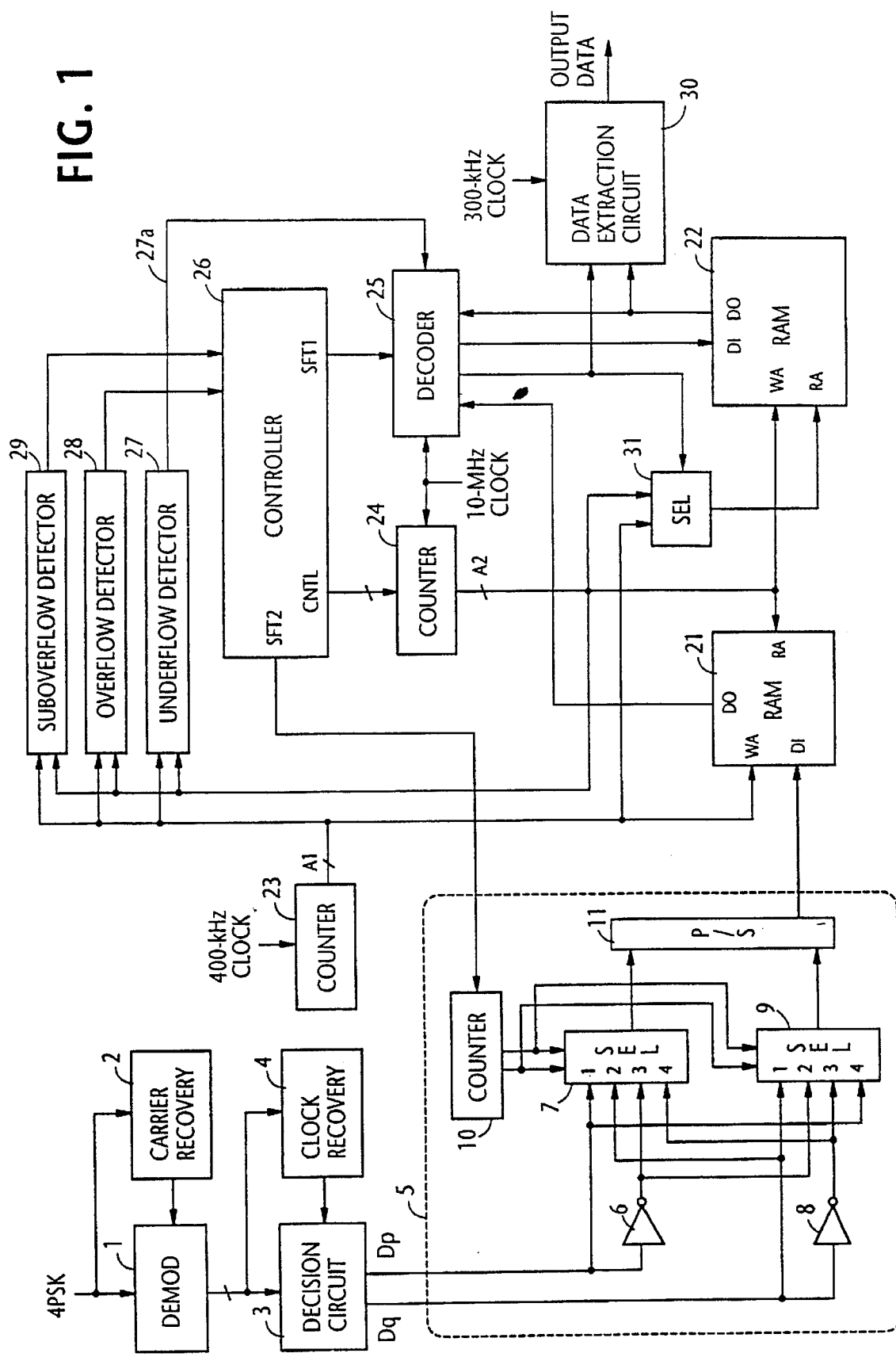
FIG. 1 is a block diagram of a sequential decoder according to a first preferred embodiment of the present invention.

Referring now to FIG. 1, there is shown a 4PSK receiver according to the present invention. The 4PSK receiver comprises a demodulator 1 to which a 4PSK signal is applied. The transmitted carrier is recovered by a carrier recovery unit 2 using a known carrier recovery technique. Demodulator 1 utilizes the recovered carrier to recover the original baseband signal, which is in turn used by a decision circuit 3 and a clock recovery circuit 8. If the code rate is ¾, the transmitted convolutional codeword is a 8-bit word which is represented by two 4PSK symbols of two bits each. The two bits of each 4PSK symbol respectively appear at Dp (in-phase) and Dq (quadrature) channel outputs of the decision circuit 3.

The outputs of decision circuit 3 are fed into a variable phase shifter 5, which includes a pair of selectors 7 and 9. Selector 7 has a set of four inputs, the first input for receiving the symbol bit Dp direct from the decision circuit, the second input for receiving the symbol bit Dq direct, the third for receiving the symbol bit Dp via an inverter 6 and the fourth input for receiving the signal Dq via an inverter 8. In like manner, the first input of selector 9 is coupled to receive the symbol bit Dq direct from the decision circuit, the second input being coupled to receive the inverted symbol bit Dp, the third input to receive the inverted symbol bit Dq, and the fourth input to receive the symbol bit Dp. Each selector is controlled by a pair of control signals supplied from a binary counter 10 to selectively couple one of the four inputs of the selector to a parallel-to-serial converter 11. The counter 10 increments its count in response to a command signal to change its binary state. When carrier phase synchronization is established, the control signals of the counter 10 are "00" and the non-inverted symbol bits Dp and Dq are supplied through the first inputs of selectors 7, 9 to the parallel-to-serial converter 11 to produce a bit sequence (Dp, Dq). In response to a first command signal, the output state of counter 10 changes to "01" and the signal at the second input of each selector is applied to the parallel-to-serial converter to produce a bit sequence (Dq, $\overline{Dp}$). In response to a second command signal, the outputs of counter 10 changes to "10" and the signal at the third input of each selector is coupled to the parallel-to-serial converter to produce a bit sequence ($\overline{Dp}$, $\overline{Dq}$). In response to a third command signal, the signal at the fourth input of each selector is coupled to the parallel-to-serial converter to produce a bit sequence ($\overline{Dq}$, Dp). The bit sequences (Dp, Dq), (Dq, $\overline{Dp}$), ($\overline{Dp}$, $\overline{Dq}$) and ($\overline{Dq}$, Dp) correspond respectively to phase shifts of 0 degree, 90 degrees, 180 degrees and 270 degrees, respectively.

The output of parallel-to-serial converter 11 is coupled to the input DI of a first buffer, or RAM 21 and each symbol bit is stored into a location specified by the address signal A1 of a first counter 23 driven at 400-kHz clock and read out of the RAM 21 through the output terminal DO in response to the address signal A2 from a second counter 24 which is driven at 10-MHz clock. The address signal A2 defines the decoding point address of the RAM 21 for reading a 4-bit sequence therefrom into a sequential decoder 25. The address count A2 of counter 24 is incremented at 10 MHz clock and controlled further by a command signal set by a controller 26 through a control (CNTL) terminal to advance the address count A2 by an amount specified by the controller.

As is well known in the art, the sequential decoder 25 essentially comprises what is known as a "replica of the convolutional encoder" to operate on each 4-bit sequence from RAM 21 to recover the original information bits according to the Fano algorithm to determine the Fano likelihood value and hence the distance to the most likely path. The output of decoder 25 is sequentially fed into an output buffer or RAM 22 via terminal DI.

To the outputs of counters 23 and 24 are connected an underflow detector 27, an overflow detector 28 and a suboverflow detector 29. Since the decoding rate is much higher than the rate at which the incoming codewords are received, the address signal $A_2$ will be incremented to such a point as approaching the address signal $A_1$ if the decoding proceeds normally. If this normal condition continues, no symbol bits will eventually be left in RAM 21, and an underflow condition will occur in RAM 21. The underflow detector 27 detects such conditions of RAM 21 and interrupts the operation of the decoder 25 by commanding it through line 27a.

If a serious burst error occurs in the transmission path, or the codeword timing (i.e., the boundary point of each codeword) of decoder 25 slips and an out-of-word timing condition occurs, or an out-of-phase timing condition occurs in the 4PSK signal in the carrier recovery process or the like, a substantial amount of delay will occur in the decoding process and RAM 21 will be overflowed and some of the previous symbol bits will be overwritten with newly arriving symbol bits. When such conditions should occur, the value of the address signal A2 will be incremented to such a point as approaching the value of the address signal A1. When there is a difference of only one node in the code tree between the 4-bit sequence just read out of RAM 21 into decoder 25 and a most recent 4-bit sequencer just written into RAM 21, A1 equals A2−1, and the overflow detector 28 supplies an overflow indication to the controller 26. On the other hand, the suboverflow detector 29 produces an output when A2 reaches a point which is short of the way to the point where the overflow condition is detected. The suboverflow condition is one that is not so serious as the overflow condition.

A selector 31 is provided for selectively applying the address count A1 or A2 to the read address input of RAM 22. When the sequential decoder 25 determines that an error has occurred in the decision process that has been performed on a given code tree, it repeats the process on a different code tree by reading back stored information bits from RAM 22. This is done by causing the selector 31 to supply the address count A2 to RAM 22. If it makes a decision that the decoding on the given code tree has been proper, the sequential decoder then commands the selector 31 and data extraction circuit 30 so that stored information bits are read from RAM 22 at the clock rate of 400 kHz into data extraction circuit 30, which subsequently reads out the data for delivery at 300 kHz clock rate because of the code rate ¾.

Figure 2A:
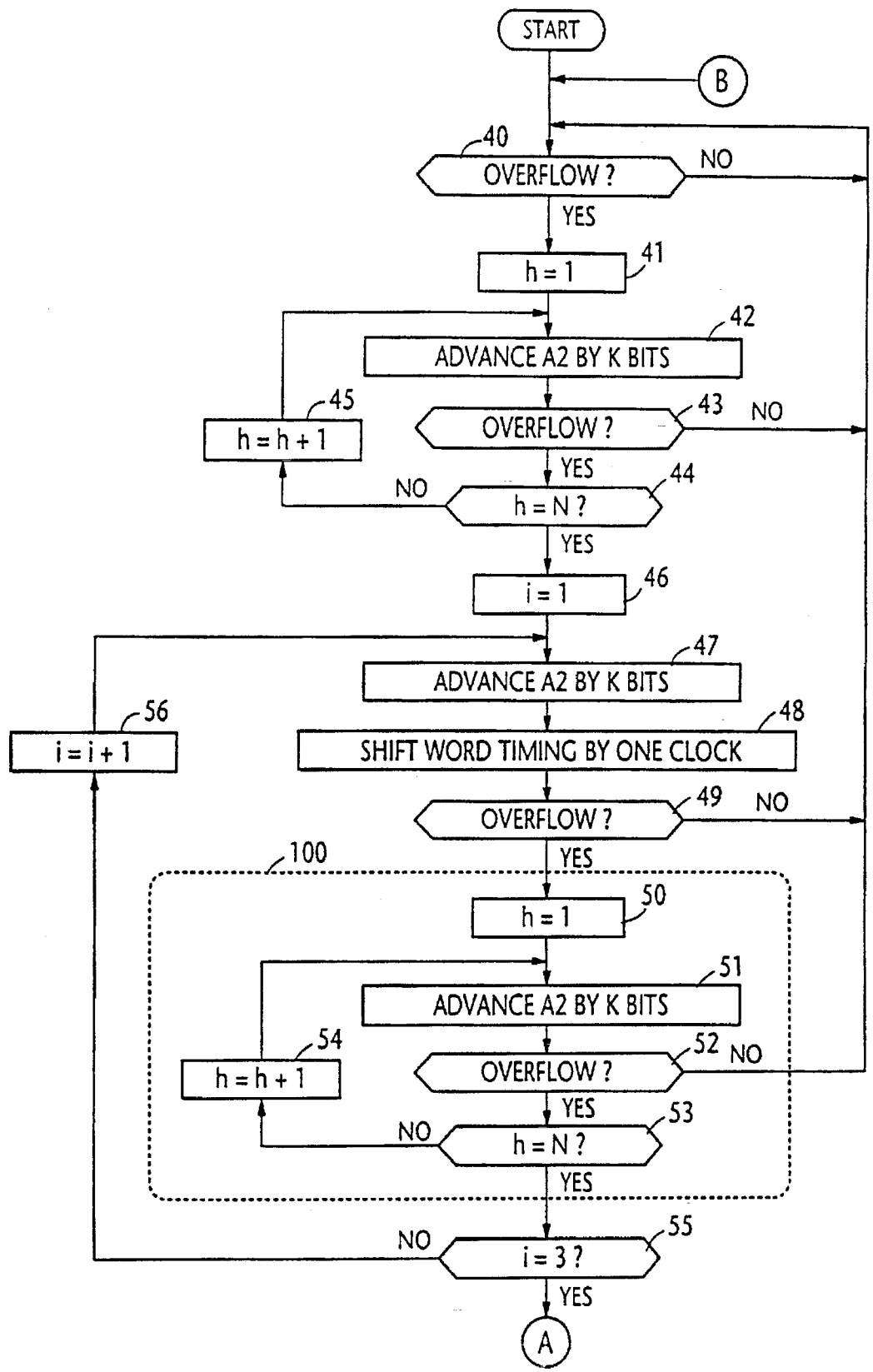
FIGS. 2A and 2B are flowcharts illustrating the operation of the controller of FIG. 1.
Figure 2B:
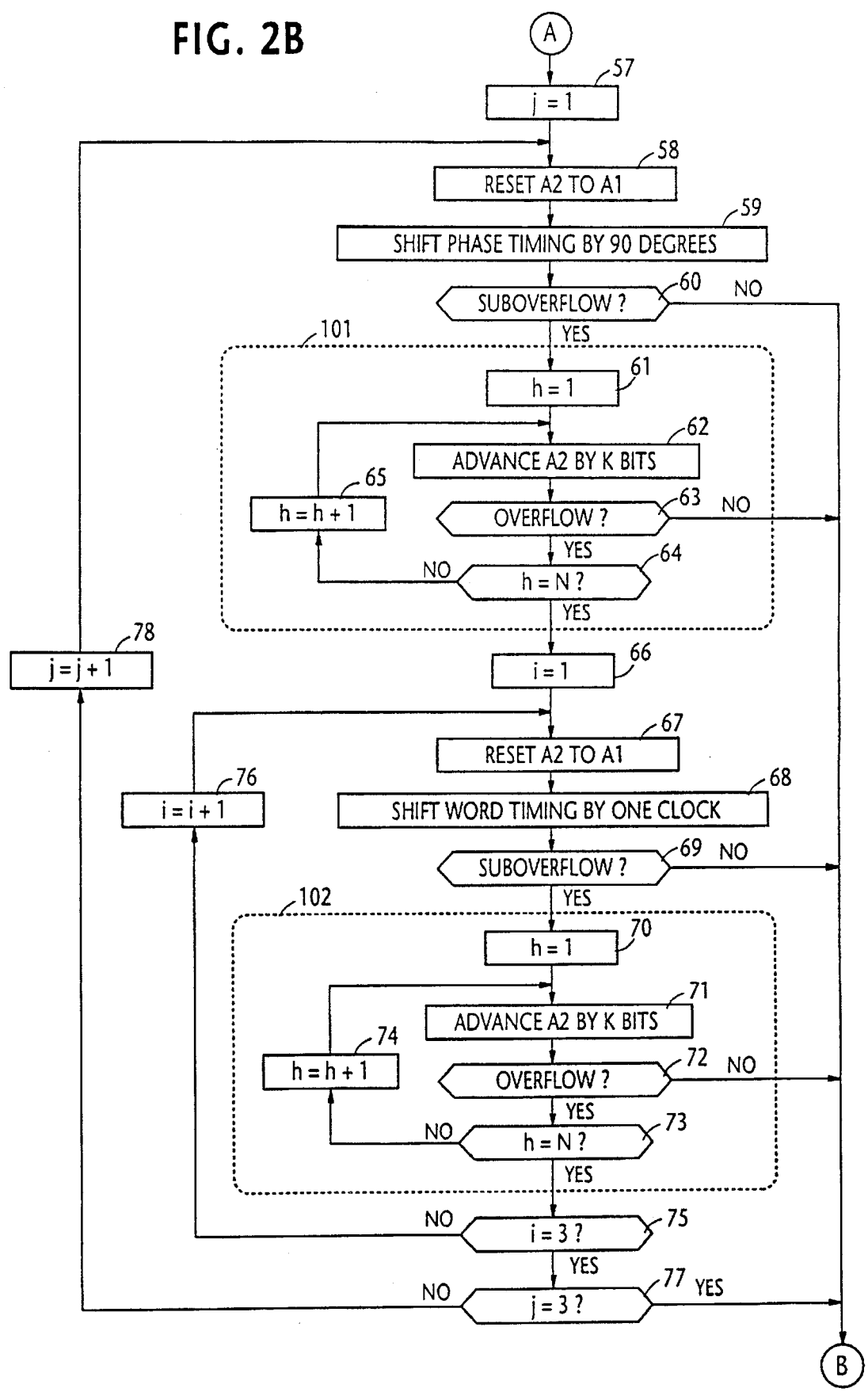

The operation of the controller 26 will now be described with reference to the flowcharts of FIGS. 2A and 2B. Starting with step 40 where the controller checks to see if an overflow indication is given by the overflow detector 30. If the overflow condition has been triggered by an irrecoverable transmission error, it is useless to continue decoding on seriously corrupted symbol bits. If the answer is affirmative at step 40, a variable h is set to 1 at step 41 and the count value A2 of counter 24 is advanced by a count value K to move the decoding point address by K bits (step 42) so that the decoder 25 restarts decoding on symbol bits received more recently than the skipped K bits. If burst errors are the sole cause of the overflow condition and they occurred in the skipped bits, the decoding proceeds properly and the overflow ceases to occur again. After skipping the K bits, control examines the output of overflow detector 28 to determine whether the overflow condition has occurred again (step 43). If the decision at step 43 is negative, control returns to step 40, recognizing that a burst error has occurred but not affected more than the skipped K bits.

If more than K bits have been corrupted by irrecoverable burst errors, the overflow condition has occurred again and the decision at step 43 is affirmative. After checking to see if h is equal to N (step 44), control proceeds to step 45 to increment h by one and returns to step 42 to repeat the skipping and overflow check process. Thus, the decoding point address is advanced by another K bits at step 42 to check to see if this is sufficient to resynchronize. Accordingly, in the worst case, the decoding address point is by K bits a maximum of N times. If burst errors are not the true cause of the overflow, variable h becomes equal to N and control branches at step 44 to step 46, assuming that the overflow has been caused by an out-of-word-timing error within the decoder 25 and possibly by burst errors at the same time. If the out-of-word-timing error is the cause of the overflow, the decoder will resume normal decoding operation by shifting the word timing by one clock interval at a time and repeating this shifting a maximum of three times since the code rate of the signal used in the present invention is ¾.

At step 46, a variable i is set to 1. The decoding point address is advanced again by K bits (step 47) and the word timing of the decoder 25 is shifted one clock interval by commanding it via terminal SFT1 (step 48). Control proceeds to step 49 to check to see if an overflow condition has occurred again. If a word timing error of a single clock interval is the cause of the overflow, a negative decision will be taken at step 49 and control returns to step 40. Otherwise, there is a possibility that the 4-bit sequence on which the decoding was just performed following step 48 have been corrupted by burst errors and similarly corrupted symbol bits still exist in RAM 21 waiting to be decoded. For this reason, control enters a burst error check subroutine 100 comprising steps 50 to 54, which correspond to steps 41 to 45, to provide the same burst error check by advancing the decoding point address by K bits. If the burst error check is performed N times and still the overflow condition repeatedly occurs, control proceeds to step 55 to check the variable i for equality to 3. If i≠3, control branches at step 55 to step 56 to increment i by one and returns to step 47 to repeat the word timing shifting and burst error checking process a maximum of three times.

If an overflow condition has occurred again even when i=3, control recognizes that there is a phase timing error in the carrier recovery process by an integral multiple of 90 degrees as well as a possibility of burst errors at the same time, and proceeds to step 57 to set a variable j to 1. If a transmitted codeword is "1011" which is affected by a phase error, the first two symbol bits of the codeword may be converted to one of "00", "01" and "11" and the second two symbol bits may be converted to one of "00", "01" and "10". If the phase error is a 90-degree advance, the first bits "10" will be converted to "11" and the second bits "11" to "01" (according to the 4PSK phase diagram where Gray code is usually employed). Since the direction of phase error is unknown, the 90-degree phase shift trial is performed a maximum of three times. Since the symbol bits affected by a phase timing error are irrecoverable, all the symbol bits stored in RAM 21 are useless. Therefore, control resets the counter 24 to the same count value as counter 21 at step 58 so that the count value A2 of counter 24 is equal to the count value A1 of counter 21. As a result, all the symbol bits stored in RAM 21 and the decoding point address are moved to the most recent symbol bit. At subsequent step 59, controller 26 commands the phase shifter 5 via terminal SFT2 to provide a 90-degree phase shift to the incoming signals Dp and Dq, allowing the decoder 25 to proceed with decoding on the 90-degree phase-shifted 4-bit sequence. Exit then is to step 60 to check the output of the suboverflow detector 29 for the presence of a suboverflow condition in RAM 21 which may occur following the decoding of the 90-degree phase-shifted bit sequence. Since the resetting of counter 24 at step 58 has cleared the overflow condition in RAM 21, it is preferred that the contents of RAM 21 be checked at some point (suboverflow) short of the way to the point of overflow. If a suboverflow condition is not detected, control recognizes that a carrier phase error of 90 degrees was the cause of the previous overflow and branches at step 60 to step 40.

If a suboverflow occurs, control recognizes that there is a possibility that the symbol bits on which the decoding was just performed following step 59 have been corrupted by burst errors as well as by a phase timing error and similarly corrupted symbol bits still exist in RAM 21 waiting to be decoded. Therefore, control proceeds to a burst error checking subroutine 101 comprising steps 61 to 65. If the execution of subroutine 101 fails to restore the decoding process, control exits to step 66 to set variable i to 1 and reset the counter 24 to the value of counter 21 at step 67 to skip all the symbol bits stored in RAM 21 and move the decoding point address to the most recent symbol bit since the phase timing error still exists in the incoming signals Dp, Dq. At subsequent step 68, control shifts the word timing of the decoder by one clock interval, assuming that the symbol bits decoded so far have been corrupted by a word timing error and possibly by the phase timing error as well. If the word timing shift at step 68 alleviates the problem, the cause of the original overflow condition is a combined effect of a 90-degree phase timing error and a single-clock word timing error, and a decision taken at subsequent suboverflow check step 68 will yield a negative answer and control returns to the start point of the program.

If the answer is affirmative at step 69, control recognizes that there is a possibility that the symbol bits on which the decoding was just performed following step 68 have been corrupted by burst errors as well as by a phase timing error and word timing error and similarly corrupted symbol bits still exist in RAM 21 waiting to be decoded, and proceeds to burst error check subroutine 102 comprising steps 70 to 74. If the execution of subroutine 102 fails to restore the decoding process, control exits to step 75 to check to see if i=3. If not, variable i is incremented by one at step 76 and control returns to step 67. Steps 67 to 76 are thus repeated a maximum of three times. Note that steps 67 to 76 are similar to steps 47 to 56, but they differs in that, at step 67, the decoding point address is moved to the position of the most recent bit, whereas, at step 47, it is moved to a point after skipping K bits.

If i=3 at step 75, control checks the variable j for equality to 3 at step 77. If not, variable j is incremented by one at step 78 and control returns to step 58 to provide another 90-degree phase shift. Thus, steps 58 to 66 are repeated a maximum of three times, successively making a test for 180-degree and 270-degree phase shift errors. For each of incremental phase shifts, burst error check is made at subroutine 101 and a word timing shift and burst error check are repeated a maximum of three times by steps 67 to 76. If all the above described attempts should fail, j becomes equal to 3 at step 77 and control returns to step 40 to restart the operation.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. A resynchronization method for resynchronizing a signal received in a receiver having means for receiving a modulated signal and recovering a transmitted carrier from the received signal, a demodulator operating on the received signal for recovering convolutionally coded symbol bits using the recovered carrier, a memory, means for sequentially storing the symbol bits into the memory, means for reading a bit sequence from the memory according to a decoding point address, a sequential decoder operating on the read bit sequence using a clock pulse as a codeword boundary point, and an overflow detector for detecting an overflow condition of said memory, said method comprising the steps of:

a) advancing said decoding point address by a predetermined number of symbol bits when said overflow condition is detected;
   b) repeating step (a);
   c) shifting the codeword boundary point by the interval of said clock pulse when said overflow condition is detected after step (a) is performed a predetermined number of times; and
   d) repeating step (c) when said overflow condition continues to occur.

2. A method as claimed in claim 1, further comprising the step of advancing said decoding point address by a predetermined number of symbol bits when said overflow condition is detected immediately following step (c).

3. In a receiver for receiving an orthogonally modulated signal of an n-bit convolutional codeword represented by m-bit symbols on a phase-shift keyed PSK or quadrature amplitude modulation QAM constellation having $2^m$ signal points, the receiver having means for recovering a transmitted carrier from the received signal, a demodulator operating on the received signal for recovering convolutionally coded symbol bits using the recovered carrier, a variable phase shifter for introducing a predetermined amount of shift to the recovered symbol bits in response to a command signal so that the signal point of the phase shifted symbol bits is moved to one of $2^m$ signal points and producing zero phase-shifted symbol bits in the absence of the command signal, a memory, means for sequentially storing symbol bits from the phase shifter into the memory, means for reading a bit sequence from the memory according to a decoding point address, a sequential decoder operating on the read bit sequence using a clock pulse as codeword boundary point, an overflow detector for detecting an overflow condition of said memory, and a suboverflow condition detector for detecting a suboverflow condition of said memory, a method comprising the steps of:

a) advancing said decoding point address by a predetermined number of symbol bits when said overflow condition is detected;
   b) repeating step (a);
   c) shifting the codeword boundary point by the interval of said clock pulse when said overflow condition is detected after step (a) is performed a predetermined number of times;
   d) shifting the decoding point address by the interval of said clock pulse when said overflow condition is still detected;
   e) advancing said decoding point address to a most recent symbol bit for reading a new it sequence from the memory when said overflow condition is continues to occur after the codeword boundary is shifted n−1 times;
   f) supplying said command signal to said variable phase shifter to allow said sequential decoder to operate on a phase shifted bit sequence;
   g) advancing said decoding point address to a most recent symbol bit for reading a new bit sequence from the memory, and shifting the codeword boundary point by the interval of said clock pulse when said suboverflow condition is detected;
   h) repeating step (g): and
   i) advancing said decoding point address to a most recent symbol bit for reading a new bit sequence from the memory and repeating the steps (f), (g) and (h) when said suboverflow condition continues to be detected after the codeword boundary print is shifted n−1 times by step.

4. A method as claimed in claim 3, further comprising the step of advancing said decoding point address by a predetermined number of symbol bits when said overflow condition is still detected immediately following the step (c).

5. A method as claimed in claim 3, further comprising the step of advancing said decoding point address by a predetermined number of the symbol bits when said suboverflow condition is detected immediately following the step (f).

6. A method as claimed in claim 3, further comprising the step of advancing said decoding point address by a predetermined number of symbol bits when said suboverflow condition is detected immediately the step (f).

7. A method as claimed in claim 3, further comprising the steps of repeating steps (1) to (I) when said overflow condition is detected after said command signal is supplied $2^m-1$ times to said variable phase shifter.

* * * * *

UNITED STATES PATENT AND TRADEMARK OFFICE
CERTIFICATE OF CORRECTION

| | | |
|---|---|---|
| PATENT NO. | : | 5,642,369 |
| DATED | : | June 24, 1997 |
| INVENTOR(S) | : | Toshiharu YAGI |

It is certified that error(s) appears in the above-identified patent and that said Letters Patent is hereby corrected as shown below:

Column 1, line 36, before "codewords" insert --the--;
line 38, after "that" insert --would produce a codeword that--.

Column 2, line 2, delete "bit sequence" and insert --codeword to the decoder--;
line 3, delete "to that replica;
line 4, delete "bit sequence" and insert --codeword--;
line 18, delete "bit sequence" and insert --codeword--;
line 22, delete "bits" and insert --symbols--.

Column 3, line 58, delete "two 4PSK" and insert --four 4PSK--.

Column 5, line 9, delete "4-bit sequence" and insert --symbol bit--;
line 10, delete "4-bit sequencer" and insert --symbol bit--.

Column 6, lines 4-5, delete "the code rate of the signal used in the present invention is 3/4" and insert --the 3/4 code rate has four coded symbols per codeword--;
line 14, delete "4-bit sequence" and insert --symbol bits.

Signed and Sealed this

Twenty-eighth Day of July, 1998

*Attest:*

BRUCE LEHMAN

*Attesting Officer*  *Commissioner of Patents and Trademarks*